United States Patent [19]

Yasuoka et al.

[11] Patent Number: 4,662,057
[45] Date of Patent: May 5, 1987

[54] METHOD OF MANUFACTURING A SEMICONDUCTOR INTEGRATED CIRCUIT DEVICE

[75] Inventors: Hideki Yasuoka; Yasunobu Tanizaki; Akira Muramatsu, all of Takasaki; Norio Anzai, Tokorozawa, all of Japan

[73] Assignee: Hitachi, Ltd., Tokyo, Japan

[21] Appl. No.: 759,441

[22] Filed: Jul. 26, 1985

Related U.S. Application Data

[62] Division of Ser. No. 520,684, Aug. 5, 1983, abandoned.

[30] Foreign Application Priority Data

Aug. 13, 1982 [JP] Japan ................................ 57-139932

[51] Int. Cl.[4] ........................................... H01L 21/425
[52] U.S. Cl. .................................... 29/571; 29/576 E; 29/576 B; 29/577 C; 148/175; 148/187
[58] Field of Search ................ 29/571, 576 B, 576 E, 29/578 C; 148/175, 187

[56] References Cited

U.S. PATENT DOCUMENTS

| | | | |
|---|---|---|---|
| 3,955,269 | 5/1976 | Magdo et al. ..................... | 29/577 R |
| 3,999,213 | 12/1976 | Brandt et al. ..................... | 357/42 |
| 4,032,372 | 6/1977 | Vora ..................... | 148/175 |
| 4,325,180 | 4/1982 | Curran ..................... | 29/571 |
| 4,346,512 | 8/1982 | Liang et al. ..................... | 148/187 X |
| 4,484,388 | 11/1984 | Iwasaki ..................... | 29/571 |
| 4,486,942 | 12/1984 | Hirao ..................... | 29/577 C |
| 4,505,766 | 3/1985 | Nagumo et al. ..................... | 29/577 C |
| 4,529,456 | 7/1985 | Anzai et al. ..................... | 29/577 C |
| 4,535,531 | 8/1985 | Bhatia et al. ..................... | 29/577 C |
| 4,536,945 | 8/1985 | Gray et al. ..................... | 29/577 C |

*Primary Examiner*—George T. Ozaki
*Attorney, Agent, or Firm*—Antonelli, Terry & Wands

[57] ABSTRACT

The present invention relates to a Bi-CMOS.IC, characterized by comprising a semiconductor substrate of a first conductivity type, and a semiconductor layer of a second conductivity type which is epitaxially grown on one major surface of said semiconductor substrate and which is electrically isolated into a plurality of semiconductor island regions by a thick surface oxide film formed by local oxidation and a semiconductor diffused layer of the first conductivity type formed between said oxide film and said substrate; a bipolar type semiconductor element being formed in one of said island regions, while CMOS type semiconductor elements are formed in the other island regions; the thick surface oxide film formed by the local oxidation being included between a base region and a collector contact region within said one island region formed with said bipolar type semiconductor element, while gate electrodes made of a semiconductor are disposed over said other island regions formed with said CMOS type semiconductor elements.

9 Claims, 13 Drawing Figures

METHOD OF MANUFACTURING A SEMICONDUCTOR INTEGRATED CIRCUIT DEVICE

This is a division of application Ser. No. 520,684 filed Aug. 5, 1983, and now abandoned.

BACKGROUND OF THE INVENTION

The present invention relates to semiconductor integrated circuit devices.

Regarding an IC wherein a bipolar element executing and analog operation and complementary MOS elementexecuting digital operations are formed on a single semiconductor substrate, so the analog and digital devices coexist (hereinbelow, termed the "Bi-CMOS-.IC"), a structure employing Al (aluminum) for the gate of the MOS element has heretofore been well known as disclosed in, for example, the official gazette of Japanese Laid-open Patent Application No. 56-152258. In case of manufacturing the Bi-CMOS.IC of the Al gate structure, it is common practice to adopt a method in which an $N^-$-type Si layer epitaxially grown on a $p^-$-type Si (silicon) substrate is isolated into several island regions of Si by p-n junctions formed by p-type diffusion, whereupon the bipolar element and the CMOS elements are formed in the respective island regions of the $n^-$-type Si layer. However, the Al gate has a width of about 8 μm and cannot be made less, and the are of the isolation region (isolation portion) cannot be reduced with the p-n junction isolation. Therefore, the prior art has had a problem in point of a high density of integration.

According to the official gazette which discloses a process for manufacturing the Bi-CMOS.IC of the Al gate structure an isolation region, the base (p-type) region of a bipolar element and a p-type well for forming an n-channel MOS element are simultaneously formed by diffusion. Further, according to the official gazette, $p^+$-type diffusions for the contact portion of the base, the source and drain of a p-channel MOS element and the surface part of the isolation region are used in common, while $n^+$-type diffusions for the emitter of the bipolar element and the source and drain of the n-channel MOS element are used in common. With such process, bipolar characteristics are inferior because the impurity concentration of the base is as low as that of the p-type well. There are, for example, the problems that the $f_T$ (current-gain-bandwidth frequency) is low (40 MHz), that the output impedance is low and that a high injection effect is liable to occur. Moreover, a high density of integration cannot be much expected because of the Al gate structure.

A Bi-MOS IC of Si gate structure which can achieve a higher density of integration than the Al gate structure has been known from the official gazetter of Japanese Laid-open Patent Application No. 55-157257, and Bi-CMOS ICs of Si gate structure have been known from the official gazettes of Japanese Laid-open Patent Applications Nos. 56-7462 and 56-15068. Since the Bi-MOS IC or the Bi-CMOS IC disclosed in the official gazette has the inter-element isolation structure which employs the LOCOS (Local Oxidation of Silicon) technique, it can achieve a still higher density of integration. However, in case of the IC's disclosed in the official gazettes of Nos. 55-157257 and 56-15068, substrate potentials are restricted, and parasitic thyristors are prone to develop. On the other hand, in case of the IC disclosed in the official gazette of No. 56-7462, circuit design is restricted because a substrate is used as the collector region of a bipolar element.

SUMMARY OF THE INVENTION

An object of the present invention is to provide a Bi-CMOS.IC in which bipolar elements and MOS elements are highly integrated in a single semiconductor body without spoiling their characteristics.

Another object of the present invention is to provide a Bi-CMOS.IC in which parasitic thyristors are less prone to develop.

Still another object of the present invention is to provide a novel method of manufacturing a Bi-CMOS-.IC.

A Bi-CMOS-IC according to the present invention comprises a semiconductor substrate of a first conductivity type, and a semiconductor layer of a second conductivity type which is expitaxially grown on one major surface of said semiconductor substrate and which is electrically isolated into a plurality of semiconductor island regions by a thick surface oxide film formed by local oxidation and a semiconductor diffused layer of the first conductivity type formed between said oxide film and said substrate; a bipolar type semiconductor element being formed in one of said island regions, while CMOS type semiconductor elements are formed in the other island regions; the thick surface oxide film formed by the local oxidation being included between a base region and a collector contact region within said one island region formed with said bipolar type semiconductor element, while gate electrodes made of a semiconductor or high-melting metal (refractory metal) are disposed over said other island regions formed with said CMOS type semiconductor elements.

A concrete method of manufacturing a Bi-CMOS.IC according to the present invention comprises the steps of preparing a p-type silicon substrate having n-type buried regions selectively formed in said substrate; epitaxially growing an n-type silicon layer on said p-type silicon substrate having n-type buried regions; forming a p-type layer within said n-type silicon layer in order to obtain island regions including said n-type buried regions; forming a p-type well in one of said island regions; locally oxidizing a surface of said n-type silicon layer with an oxidation impermeable mask so as to form a thick oxide film on said surface of said n-type silicon layer; introducing an n-type impurity for a collector contact of a bipolar transistor and introducing a p-type impurity for a base thereof into another of said island regions by employing said thick oxide film as masks; forming gate insulator films on surfaces of said p-type well and still another of said island regions; forming polycrystalline silicon on said gate insulator films; introducing a p-type impurity for forming a source and a drain of a p-channel MOS field effect transistor, into said still another island region by employing a part of said polycrystalline silicon as a mask; and introducing an n-type impurity for forming a source and a drain of an n-channel MOS field effect transistor, into said p-type well by employing another part of said polycrystalline silicon as a mask, and simultaneously introducing an n-type impurity for an emitter of said bipolar transistor into the base region.

DESCRIPTION OF THE PREFERRED EMBODIMENTS

The characterizing features of the present invention will be readily understood from the following description of the most preferred embodiments taken with reference to the drawings.

FIGS. 1 to 12 show the states of a Bi-CMOS.IC at principal steps, in typical sections.

Figure 1:
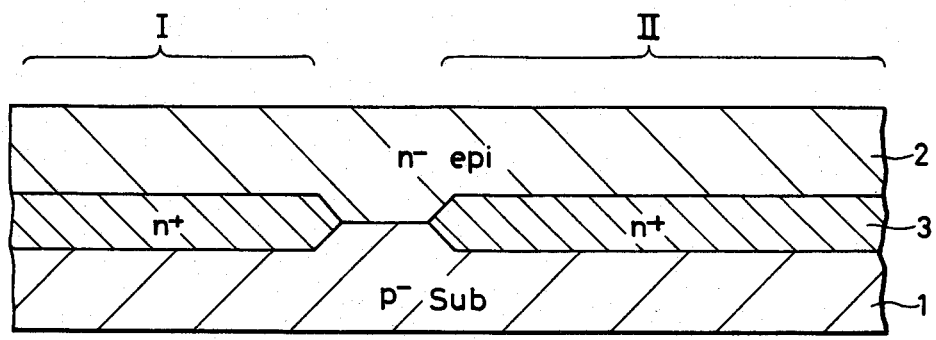
FIGS. 1 to 12 are sectional views of an IC at various steps showing a Bi-CMOS.IC process according to the present invention.
Figure 2:
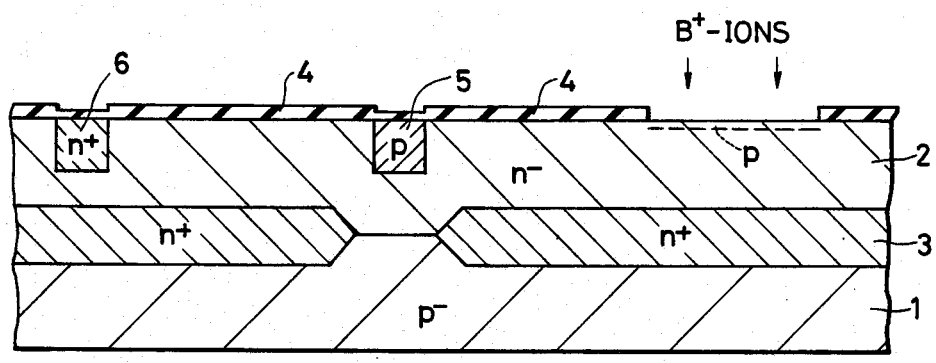

(1) As shown in FIG. 1, after selectively depositing Sb (antimony) or the like on one major surface of a $p^-$-type high-resistivity Si substrate (substrate in the form of a wafer) 1, and $n^-$-type Si layer 2 ($8\mu$–$12\mu$ thick) having a low impurity concentration and a uniform impurity profile in its depthwise direction is formed on the substrate by epitaxial growth, and simultaneously, $n^+$-type buried regions 3 having a predetermined thickness are formed between the $p^-$ substrate and the $n^-$ layer. In the figure, an area I is an area in which a bipolar element is formed, and an area II is an area in which CMOS elements are formed.

(2) An oxide film 4 is formed on the surface of the $n^-$ layer 2 by oxidizing the surface, and it is windowed. The windows except one are covered with a mask (not shown), and a p-type diffused layer (isolation layer) 5 is formed by the 2-step impurity introduction of depositing and diffusion B (boron) impurity for isolation. Likewise, in the area I, an $n^+$-type diffused layer 6 is formed in another window for the collector contact of the n-p-n transistor by the 2-step impurity introduction of depositing and diffusing P (phosphorus) impurity. The p-type diffused layer 5 and $n^+$ diffused layer 6 are diffused to a thickness of approximately half of that of the $n^-$ layer 2. Further, in the area II, B (boron) ions are implanted into one window in order to form a p-type well (refer to FIG. 2).

Figure 3:
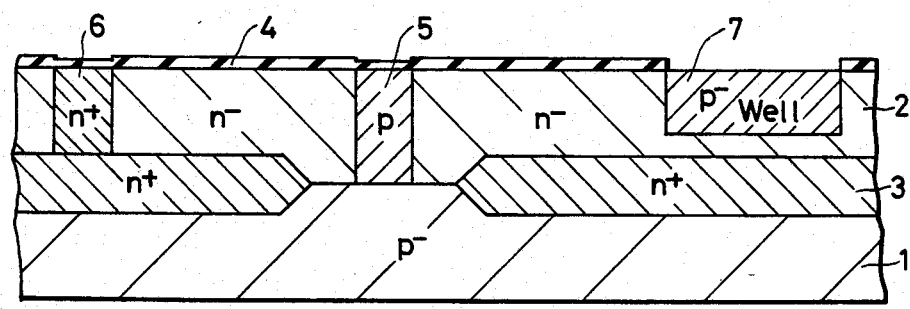

(3) By performing the drive-in diffusion of the well, the $p^-$-type well 7 is formed as shown in FIG. 3. At the same time, the p-type diffused layer 5 connects to the $p^-$ substrate 1 to isolate the area I and the area II. Also the $n^+$-type diffused layer 6 of the collector contact reaches the $n^+$ buried region 3.

Figure 4:
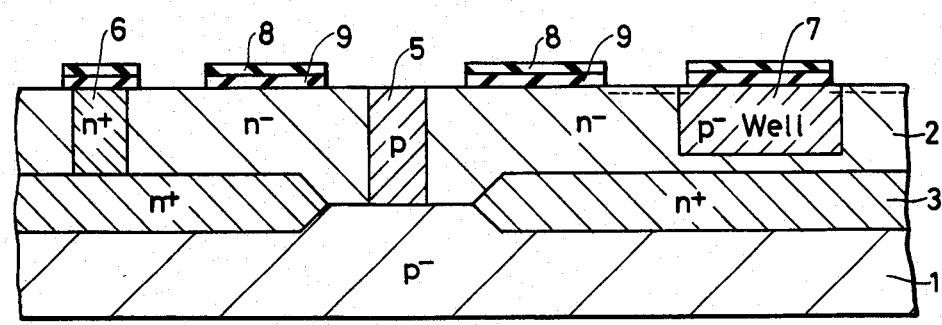

(4) The oxide film on the whole surface is once removed. Thereafter, as shown in FIG. 4, a thin oxide (silicon oxide) film 9 is formed anew, as is conventional (formed by thermal oxidation) in forming oxidation impermeable masks utilizing silicon nitride, on which $Si_3N_4$ (silicon nitride) 8 is deposited, whereupon an oxidation impermeable mask for local oxidation is formed by mask processing. Subsequently, parts of the area II are implanted with the ions of an n-type impurity and a p-type impurity for channel stoppers after applying a photoresist on parts and by utilizing the oxidation impermeable mask.

Figure 5:
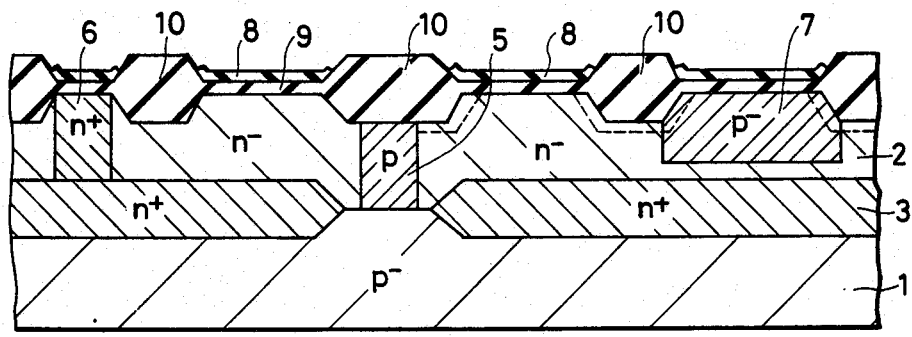

(5) By performing low-temperature oxidation, the parts of the Si surface not formed with the oxidation impermeable mask are locally formed with thick field oxide films 10 as shown in FIG. 5. During the oxidation treatment, the p-type and n-type channel stoppers (indicated by dotted lines) are formed under the field oxide films.

Figure 6:
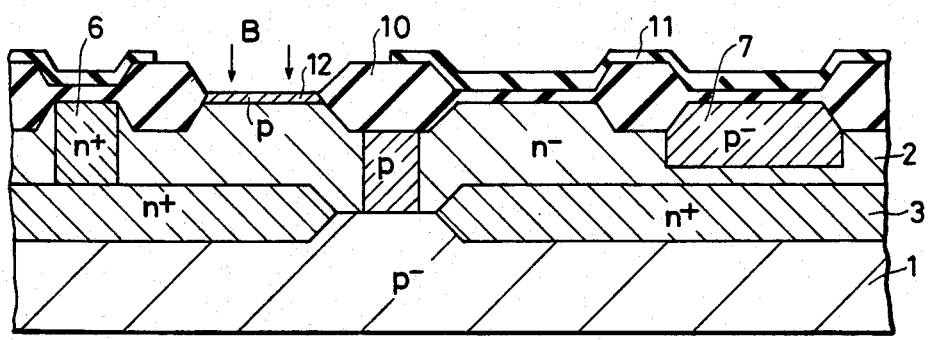

(6) The $Si_3N_4$ 8 and the underlying thin oxide film 9 are removed to expose the Si surface. The exposed Si surface is lightly oxidized to form a thin oxide film 11, deposited by the low-temperature oxidation of Si. As shown in FIG. 6, only a base part is windowed, and B (boron) impurity is deposited thereon (or ions are implanted therein) to form a shallow p-type diffused layer 12.

Figure 7:
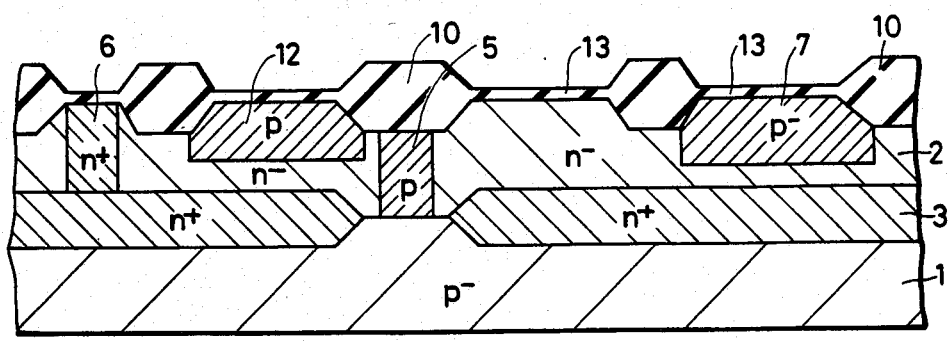

(7) In order to form gate insulator films, the surface of the area II is etched, and gate oxidation is carried out, thereby to form the gate oxide films 13 of the MOS elements, as shown in FIG. 7 and an oxide film over diffused layer 12; in this regard, the impurities are subjected to drive-in diffusion to form layer 12, as shown in FIG. 7.

Figure 8:
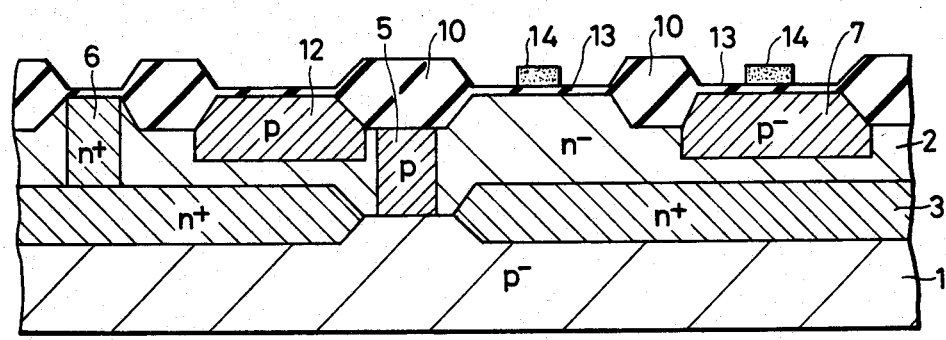

(8) Polycrystalline silicon (poly-Si) is deposited on the whole surface, and the unnecessary part thereof is removed by photoetching, whereby poly-Si gates 14 are formed in parts of the area II as shown in FIG. 8.

Figure 9:
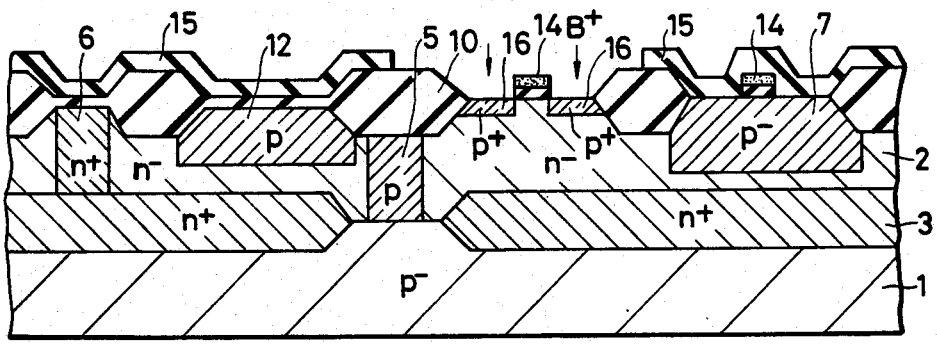

(9) An oxide (silicon oxide) film 15 is deposited by CVD. As shown in FIG. 9, only a part to become the p-channel MOS element is windowed, and using the poly-si gate 14 as a mask, B (boron) impurity is deposited and then diffused to form a $p^+$ source and drain 16 in self-alignment fashion.

Figure 10:
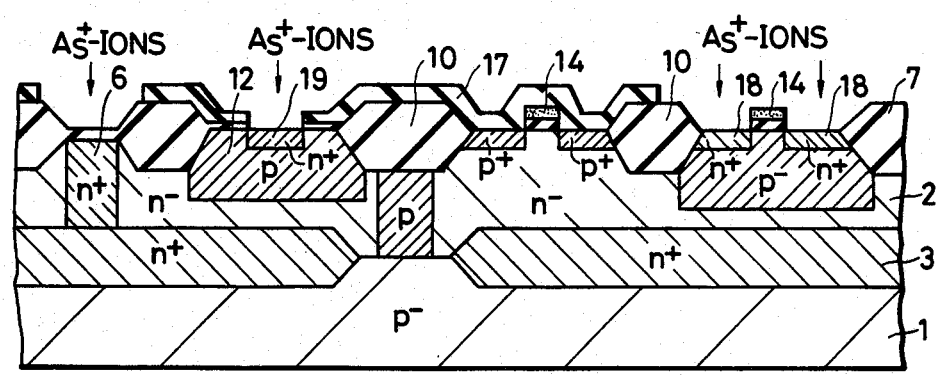

(10) A new CVD.oxide (silicon oxide film formed by chemical vapor deposition) film 17 is formed. As shown in FIG. 10, parts to form the source and drain of the n-channel MOS element and a part to form the emitter of the bipolar n-p-n element are windowed, and As (arsenic) ions are implanted into the parts and then diffused by drive-in diffusion, thereby to form the $n^+$-type source and drain 18 and the $n^+$-type emitter 19. At this time, in order to simultaneously attain a favorable ohmic contact, the collector contact region 6 is also implanted with the As ions, that is, it has additional impurity atoms introduced therein.

Figure 11:
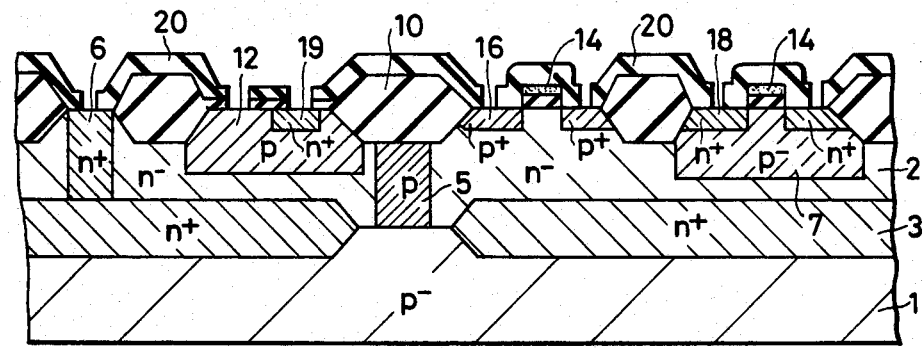

(11) An insulator film 20 of PSG (phosphosilicate glass) or the like is deposited on the whole surface. Thereafter, as shown in FIG. 11, contact holes are formed by photoetching, to expose the contact parts of the various regions.

Figure 12:
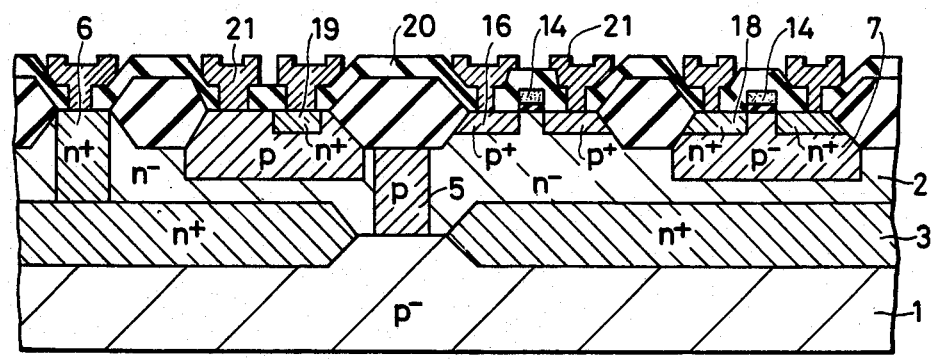

(12) Al (aluminum) is evaporated (or sputtered) on the whole surface, and is photoetched. Thereafter, the resultant structure is annealed with $H_2$ kept flowing, whereby Al electrodes 21 held in ohmic contact with the respective regions ae formed as shown in FIG. 12. Some of the Al electrodes extend on the PSG film, and serve as Al wiring leads to electrically connect the desired ones of the various regions.

Figure 13:
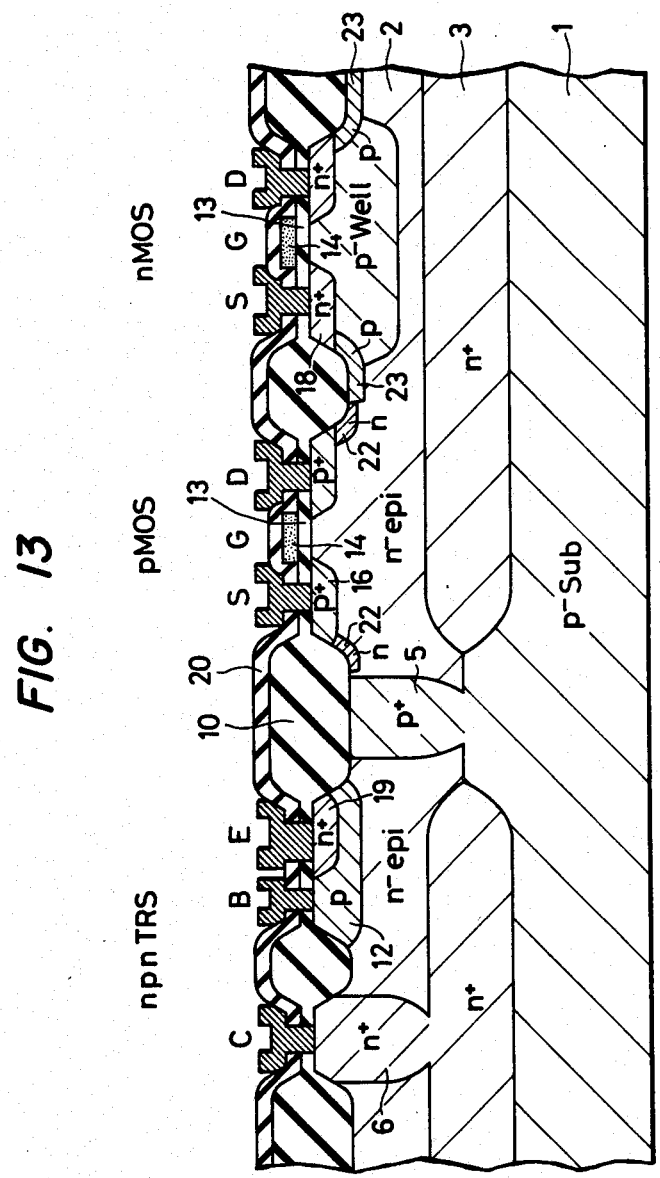
FIG. 13 is a sectional view showing an embodiment of a Bi-CMOS.IC according to the present invention.

FIG. 13 is a sectional view typically illustrating the Bi-CMOS.IC finished up. In the figure, numerals 22 and 23 designate the channel stoppers.

According to the present invention described above in connection with the embodiments, the objects of the invention can be accomplished for the following reasons:

(1) By employing the epitaxial Si layer of low impurity concentration as the element forming portion, the $V_{th}$ (threshold voltage) of the p-channel MOS element can be determined. In conformity with the epitaxial concentration, the dose of the ion implantation for the p-type well of low impurity concentration can be determined, and the $V_{th}$ of the n-channel MOS element formed in the p-type well can be determined. Another merit is that the $BV_{CBO}$ (collector-base breakdown voltage) is easily controlled in the bipolar element.

(2) Owing to the use of the epitaxial Si layer and the provision of the n+ buried region under the MOS elements, latchup is prevented, that is, the formation of a parasitic thyristor is prevented.

(3) The thick oxide film and the diffused junction are jointly used for isolating the area of the bipolar element and that of the MOS elements. This measure reduces the lateral spread of diffusion in comparison with the isolation based on only the diffused junction as in the case of the conventional CMOS.IC, and it realizes a higher density of integration and is effective to prevent latchup.

(4) Within the bipolar element, the thick oxide film partly buried in the epitaxial Si layer exists between the collector contact region and the base region. As apparent from FIG. 6, this thick oxide film is a diffusion mask for forming the base region and suppresses the base diffusion in the lateral direction. Besides, as apparent from FIG. 10, it suppresses the collector contact diffusion in the lateral direction during the additional ion implantation (or diffusion) into the collector contact region. Accordingly, even when the mask registration allowance between the base region and the collector contact region of high impurity concentration is set to be sufficient, both the regions do not touch. Therefore, the occupying area of one bipolar element decreases, while the $BV_{CBO}$ (collector-base breakdown voltage) thereof does not lower.

(5) Owing to the use of the poly-Si gate for each C-MOS element, the source and drain can be diffused in self-alignment fashion. Therefore, the mask registration error need not be considered, and the gate length can be made as small as about 5 $\mu$m. The use of the poly-Si gates realizes a higher density of integration, conjointly with the use of the thick oxide film for the isolation between the p-channel element and the n-channel element. In accordance with the present invention employing the Si gates, it has been possible to reduce the chip area by 25% as compared with that in the case of using Al gates.

(6) Owing to the fact that the source and drain of the n-channel MOS element are formed by the diffusion step common to the diffusion of the emitter of the n-p-n element, the gate length of the n-channel MOS element can be made small. With the Bi-CMOS.IC manufacturing process disclosed in the official gazette of Japanese Laid-open Patent Application No. 56-152258 referred to before, when the emitter diffusion is deep, the gate length of the n-channel MOS element must be made great. In contrast, according to the present invention, the emitter diffusion is performed as shallow as possible to the end of avoiding the drawback. Accordingly, the condition of the base diffusion becomes very important for bringing the $h_{FE}$ (grounded-emitter d-c current gain) of the bipolar transistor into 100–400. In accordance with the present invention, as understood from the above embodiment, the base region is formed by the step separate from that for forming the p-type well and after the formation of the thick local oxidation films taking a long time. Accordingly, the emitter region can be formed shallower than the base region and the p-type well. Therefore, even the bipolar transistor having the aforementioned $h_{FE}$ can be formed readily without affecting the MOS element.

(7) Since the base diffusion of the bipolar element is carried out before the gate oxidation, it does not affect the gate oxide films. Therefore, the thickness of the gate oxide film or the $V_{th}$ of the CMOS element can be readily controlled.

(8) The ion implantation is performed using the $Si_3N_4$ for forming the thick oxide film, as a mask, and the dose of the implantation is properly stipulated, whereby the $V_{th}$ of a parasitic MOS transistor on the p-type well or a parasitic MOS transistor on the n−-type epitaxial layer can be raised.

(9) Owing to the fact that the drive-in diffusions of the p-type well and the junction isolation p-type layer are simultaneously performed, the number of steps can be reduced. The p-type well has its impurity concentration restricted because the $V_{th}$ of the n-channel MOS element is determined by the surface concentration. In addition, the depth of the well needs to be at least 5 $\mu$m. Meanwhile, the depth of the junction isolation p-type diffusion must be, at least, equal to the thickness of the epitaxial layer. Therefore, the junction isolation p-type diffusion is performed down to the proper depth in advance as seen from FIG. 2, whereby the simultaneous drive-in diffusions are permitted.

(10) In case of forming in the identical semiconductor substrate a circuit which requires a Zener diode having a Zener voltage of 5–6 V, the Zener diode may be formed by utilizing the p-n junction between a p-type semiconductor region formed simultaneously with the source and drain of the p-channel MOS element and an n+-type semiconductor region formed simultaneously with the emitter of the bipolar element, and the aforementioned Zener voltage is readily attained by raising the impurity concentration of the source and drain of the p-channel element.

(11) Since the p-type well is formed prior to the thick oxide film (field oxide film), the thick oxide film can be formed also in the p-type well. Accordingly, a plurality of n-channel MOS elements can be formed within the single p-type well. Moreover, the limits of a service supply voltage can be extended. That is, owing to the presence of the thick oxide film, a parasitic MOS transistor becomes less liable to appear.

(12) Prior to the formation of the base region, the deep collector contact region is formed within the epitaxial Si layer so as to touch the buried region, so that the influence thereof on the base region can be prevented. Particularly in the embodiment, the collector contact is formed prior to the formation of the p-type well, whereby the influence thereof on the p-type well is also prevented. The collector contact region is held in contact with the buried region in order to lower the collector resistance.

(13) In view of the above, a minute CMOS.IC for logic operations and a bipolar IC for linear operations can be assembled on an identical chip (substrate). Moreover, a product of high performance can be provided without spoiling the characteristics of the respective ICs.

Besides the foregoing embodiments, the present invention shall cover the following modifications:

(1) A high-melting metal such as Mo (molybdenum), other than Si, may be used for the gate electrode. Preferable for the gate electrode is a semiconductor or high-melting metal which can withstand diffusion temperatures.

(2) The p-well is used as junction isolation means for elements.

(3) The base diffusion of the bipolar element is performed simultaneously with the source and drain diffusion of the p-channel MOS element.

(4) The emitter diffusion of the bipolar element and the source and drain diffusion of the n-channel MOS element are performed by separate steps.

(5) The n+ buried regions under some MOS elements are omitted.

The present invention is effective when utilized in a linear IC having a logic memory of which low power dissipation is required, a linear IC including power MOSFETs, or an IC having a high driving capability in a gate array or MOS logic.

Lastly, the "Si gate electrode" in the present invention shall cover, not only an electrode made of Si alone, but also an electrode made of Si in which another metal material is contained, or a stacked electrode structure consisting of layers of Si and another metal material. Moreover, the MOS element does not have its gate insulator film restricted to the oxide film, but also a case of silicon nitride ($Si_3N_4$) shall be covered.

We claim:

1. A method of manufacturing a semiconductor integrated circuit device comprising the steps of:

selectively forming a plurality of first regions of a second conductivity type in said semiconductor substrate, said semiconductor substrate being of a first conductivity type;

epitaxially growing a semiconductor layer of a second conductivity type on the surface of said semiconductor substrate, whereby said first regions become buried regions of the second conductivity type in said semiconductor substrate;

introducing a first conductivity type impurity for forming an isolation layer into said semiconductor layer in order to obtain first and second island portions of the second conductivity type including said buried regions;

introducing a first conductivity type impurity for forming a well region of the first conductivity type into said first island portion of said semiconductor layer;

selectively forming a thick oxide film on the surface of said isolation layer by local oxidation;

introducing a first conductivity type impurity for forming a base region of a transistor into said second island portion of said semiconductor layer;

selectively forming gate insulator films on the surfaces of said well region and said first island portion;

after the step of selectively forming gate insulator films on the surfaces of said well region and said first island portion, forming gate electrodes of MOSFETs on said gate insulator films, respectively;

introducing a first conductivity type impurity for forming a source region and a drain region of a MOSFET of a channel of the first conductivity type into said first island portion, using said gate electrode formed on said first island portion as a mask; and introducing said second conductivity type impurity for forming an emitter region of said transistor into said base region and simultaneously introducing said second conductivity type impurity for forming a source region and a drain region of a MOSFET of the second conductivity type into said well region, using the gate electrode formed on said well region as a mask.

2. A method of manufacturing a semiconductor integrated circuit device according to claim 1, wherein said first conductivity type is the p-type, and said second conductivity type is the n-type.

3. A method of manufacturing a semiconductor integrated circuit device according to claim 1, wherein said semiconductor layer has a thickness of 8-12 $\mu$m.

4. A method of manufacturing a semiconductor integrated circuit device according to claim 1, wherein said first conductivity type impurity is boron.

5. A method of manufacturing a semiconductor integrated circuit device according to claim 1, wherein said second conductivity type impurity is arsenic.

6. A method of manufacturing a semiconductor integrated circuit device according to claim 1, wherein said gate insulator films comprise oxide films.

7. A method of manufacturing a semiconductor integrated circuit device according to claim 6, wherein said oxide films are silicon oxide films.

8. A method of manufacturing a semiconductor integrated circuit device according to claim 1, wherein said gate electrodes comprise polycrystalline silicon.

9. A method of manufacturing a semiconductor integrated circuit device according to claim 1, wherein, prior to selectively forming the thick oxide film on the surface of the isolation layer by local oxidation, second conductivity type impurity for forming a collector contact of said transistor is introduced into said semiconductor layer.

* * * * *